United States Patent
Chen et al.

(10) Patent No.: US 12,333,086 B2
(45) Date of Patent: Jun. 17, 2025

(54) COMPOSITE FUNCTION KEYBOARD CIRCUIT

(71) Applicant: Primax Electronics Ltd., Taipei (TW)

(72) Inventors: Yi-Liang Chen, Taipei (TW);
Chih-Chen Chang, Taipei (TW);
Chien-Ming Li, Taipei (TW)

(73) Assignee: Primax Electronics Ltd., Taipei (TW)

( * ) Notice: Subject to any disclaimer, the term of this patent is extended or adjusted under 35 U.S.C. 154(b) by 208 days.

(21) Appl. No.: 18/143,552

(22) Filed: May 4, 2023

(65) Prior Publication Data
US 2024/0310926 A1    Sep. 19, 2024

(30) Foreign Application Priority Data
Mar. 17, 2023    (TW) .................................. 112110126

(51) Int. Cl.
| | | |
|---|---|---|
| *G06F 3/023* | (2006.01) | |
| *H01H 13/703* | (2006.01) | |
| *H01H 13/785* | (2006.01) | |
| *H01H 13/79* | (2006.01) | |
| *H01H 13/80* | (2006.01) | |
| *H03K 17/96* | (2006.01) | |

(52) U.S. Cl.
CPC .......... *G06F 3/0233* (2013.01); *G06F 3/0238* (2013.01); *H01H 13/703* (2013.01); *H01H 13/785* (2013.01); *H01H 13/79* (2013.01); *H01H 13/80* (2013.01); *H03K 17/9625* (2013.01)

(58) Field of Classification Search
CPC .. H01H 2217/012; H01H 13/00; H01H 13/26; H01H 13/70; H01H 13/7006; H01H 13/7013; H01H 13/702; H01H 13/703; H01H 13/78; H01H 13/785; H01H 13/79; H01H 13/80; H01H 3/00; H01H 3/12; H01H 2003/12; H01H 2013/00; H01H 2013/02; H01H 2013/50; H01H 2013/52; H03K 17/9625; G06F 3/0233; G06F 3/0238

USPC ......................................................... 200/5 R
See application file for complete search history.

(56) References Cited

U.S. PATENT DOCUMENTS

| | | | | |
|---|---|---|---|---|
| 4,633,228 | A * | 12/1986 | Larson | ................... H03M 11/02 714/E11.005 |
| 5,448,236 | A * | 9/1995 | Shiga | ................... H03M 11/003 341/26 |
| 8,159,372 | B2 * | 4/2012 | Sherman | .............. H03M 11/003 341/26 |

* cited by examiner

*Primary Examiner* — Anthony R Jimenez
(74) *Attorney, Agent, or Firm* — KIRTON McCONKIE; Evan R. Witt

(57) ABSTRACT

A composite function keyboard circuit includes a first matrix circuit, a first bias resistor group, a second matrix circuit, a second bias resistor group and a controller. Each switch unit in the first matrix circuit is an ink-type force sensing switch. A resistance of the ink-type force sensing switch is variable according to a pressing mode of a keypress action. An electrical connection path is formed between the ink-type force sensing switch and the corresponding bias resistor of the second bias resistor group. When the ink-type force sensing switch is electrically conductive, a divided sensing voltage is generated by the electrical connection path, and the controller generates a corresponding key control instruction according to a level of the divided sensing voltage. Furthermore, the cooperation of the first matrix circuit and the first bias resistor group can achieve a ghost key preventing function.

18 Claims, 4 Drawing Sheets

COMPOSITE FUNCTION KEYBOARD CIRCUIT

FIELD OF THE INVENTION

The present invention relates to an input device keyboard circuit, and more particularly to a composite function keyboard circuit with a pressure sensing function and a ghost key preventing function.

BACKGROUND OF THE INVENTION

Conventionally, a keyboard device comprises a keyboard circuit. When a single key of the keyboard device is pressed down, the keyboard circuit is triggered to generate a key signal. Furthermore, when a set of keys are pressed down simultaneously, a specified result is generated. The set of keys are also referred as a combination key. For example, when the "Shift" key and the "A" key are pressed down simultaneously by the user, a controller of the keyboard circuit issues a combination key code corresponding to the depressed keys. The combination key code represents a key control instruction for executing a specified control function (e.g., an "acceleration" function).

However, the method of simultaneously pressing down two keys or a combination key to execute a specified control function is not suitable for the applications requiring the fast operation speed (e.g., the applications on electronic sports). For example, the action of simultaneously pressing down two keys or a combination key to execute a specified control function increases the operating time or increases the probability of pressing errors. Therefore, the manufactures pay much attention to provide a method or a mechanism of executing various types of key function instructions by triggering a single key.

Nowadays, some solutions have been proposed in the market. For example, a single key is operated to execute various types of key function instructions according to the continuous change characteristics of a capacitive sensing technology or an optical sensing technology. However, the cost of implementing the above solution is high, or the method of implementing the above solution is very difficult. In addition, since the keyboard device using these technologies is very complicated, it is difficult to reduce the overall volume of the assembled structure of the keyboard device.

On the other hand, the keyboard circuit is further equipped with a mechanism for preventing from the ghost key phenomenon. For avoiding the ghost key phenomenon, the keyboard circuit comprises plural diodes near the corresponding key switches. Since the current is allowed to flow in one direction through the arrangement of the diode, the above-mentioned ghost key phenomenon can be avoided. However, the arrangement of the diodes near the corresponding key switches still has some drawbacks. For example, since the diode is not cost-effective, the cost of the keyboard device is largely increased.

In order to overcome the drawbacks of the conventional technologies, it is important to provide an improved keyboard circuit for operating a single key to execute various types of key function instructions in a cost-effective and reliable manner while avoiding the ghost key phenomenon.

SUMMARY OF THE INVENTION

In order to overcome the drawbacks of the conventional technologies, the present invention provides a composite function keyboard circuit with a pressure sensing function and a ghost key preventing function.

In accordance with an aspect of the present invention, a composite function keyboard circuit is provided. The composite function keyboard circuit includes a first matrix circuit, a first bias resistor group, a second matrix circuit, a second bias resistor group and a controller. The first matrix circuit includes a first driving line group with plural first driving lines, a first sensing line group with plural first sensing lines and a first switch unit group with plural first switch units. The plural first driving lines and the plural first sensing lines are arranged in a matrix. Each of the first switch units of the first switch unit group is electrically connected with a corresponding first sensing line and a corresponding first sensing line. The first bias resistor group is electrically connected with the first sensing line group and electrically connected with the first switch unit group in series. The first bias resistor group includes plural first bias resistors. A first terminal of each of the plural first bias resistors of the first bias resistor group is electrically connected with the first sensing line group and the first switch unit group. A second terminal of each of the plural first bias resistors of the first bias resistor group is electrically connected with a ground terminal. The second matrix circuit includes a second driving line group with at least one second driving line, a second sensing line group with plural second sensing lines and a second switch unit group with plural second switch units. The at least one second driving line and the plural second sensing lines are arranged in a matrix. Each of the second switch units of the second switch unit group is electrically connected with a corresponding second sensing line and a corresponding second sensing line. The second bias resistor group is electrically connected with the second sensing line group and electrically connected with the second switch unit group in series. The second bias resistor group includes plural second bias resistors. A first terminal of each of the plural second bias resistors of the second bias resistor group is electrically connected with the second sensing line group and the second switch unit group. A second terminal of each of the plural second bias resistors of the second bias resistor group is electrically connected with the ground terminal. The controller is electrically connected with the first driving line group, the first sensing line group, the first terminal of each of the first bias resistors of the first bias resistor group, the second driving line group, the second sensing line group and the first terminal of each of the second bias resistors of the second bias resistor group. Each of the second switch units of the second switch unit group is an ink-type force sensing switch. A resistance of the ink-type force sensing switch is variable according to a pressing mode of a keypress action. An electrical connection path is formed between the ink-type force sensing switch and a corresponding second bias resistor of the second bias resistor group. When the ink-type force sensing switch is electrically conductive, a divided sensing voltage is generated by the electrical connection path, and the controller generates a corresponding key control instruction according to a level of the divided sensing voltage.

In an embodiment, the ink-type force sensing switch unit at least includes a top printed conductive film, a bottom printed conductive film and an elastic separation layer. The elastic separation layer is arranged between the top printed conductive film and the bottom printed conductive film.

In an embodiment, the top printed conductive film at least includes a top substrate, an upper conductive silver paste layer and an upper carbonaceous conductive ink layer, and the bottom printed conductive film at least includes a lower carbonaceous ink layer, a lower conductive silver paste layer and a bottom substrate. In addition, an adhesive layer is arranged between the top substrate and the bottom substrate.

In an embodiment, at least one of the top substrate and the bottom substrate is made of polyethylene terephthalate (PET), or the elastic separation layer is made of UV (ultra-violet)-curable adhesive.

In an embodiment, a number of the second switch units of the second switch unit group and a number of the second bias resistors of the second bias resistor group are identical. Consequently, each of the second switch units of the second switch unit group is electrically connected with one of the plural second bias resistors of the second bias resistor group.

In an embodiment, when the level of the divided sensing voltage corresponding to the ink-type force sensing switch is lower than a voltage threshold value, the ink-type force sensing switch is in a light keypress mode, and the controller generates a single key control instruction. Whereas, when the level of the divided sensing voltage is higher than or equal to the voltage threshold value, the ink-type force sensing switch is in a heavy keypress mode, and the controller generates a combination key control instruction.

In an embodiment, the voltage threshold value is set by a user through an application software.

In an embodiment, each of the first switch units of the first switch unit group includes a key switch and a switch resistor. The key switch and the corresponding switch resistor in each first switch unit are collaboratively formed as an additional electrical connection path. When the key switch of a specified first switch unit of the plural first switch units is electrically conductive, a divided conduction voltage from the key switch of the specified first switch unit is obtained by the controller through the additional electrical connection path, and the controller judges whether the key switch of the specified first switch unit is effectively pressed down and normally turned on.

In an embodiment, each of the plural first driving lines of the first driving line group is connected with the key switch of at least one first switch unit, and the switch resistor of the at least one first switch unit is electrically connected with the first sensing line group.

In an embodiment, at a first time point, the controller provides a working voltage to a first one of the plural first driving lines of the first driving line group, and divided conduction voltages from the at least one first switch unit connected with the first one of the plural first driving lines are transmitted through the first sensing line group. Moreover, at a second time point, the controller provides the working voltage to a second one of the plural first driving lines of the first driving line group, and divided conduction voltages from the at least one first switch circuit connected with the second one of the plural first driving lines are transmitted through the first sensing line group.

In an embodiment, when the divided conduction voltage corresponding to a specified first switch unit of the plural first switch units lies in a first voltage range, the controller judges that the key switch of the specified first switch unit is normally turned on. Whereas, when the divided conduction voltage corresponding to the specified first switch unit lies in a second voltage range, the controller judges that the key switch of the specified first switch unit is not normally turned on.

In an embodiment, the working voltage is Vin, and the first voltage range is from 0.228×Vin to 0.5×Vin.

In an embodiment, the working voltage is Vin, and the second voltage range is 0.064×Vin to 0.226×Vin.

In an embodiment, the working voltage is 5V.

In an embodiment, the first voltage range is from 1.14V to 2.5V.

In an embodiment, the second voltage range is 0.32V to 1.13V.

In an embodiment, a resistance of the switch resistor in each first switch unit is equal to or nearly equal to a resistance of a corresponding first bias resistor.

In an embodiment, the controller includes a multiplexer, an analog-to-digital converter and a processor. The multiplexer is electrically connected with the first sensing line group, the first terminal of each of the plural first bias resistors of the first bias resistor group, the second sensing line group and the first terminal of each of the plural second bias resistors of the second bias resistor group. The analog-to-digital converter is electrically connected with the multiplexer. The processor is electrically connected with the multiplexer, the analog-to-digital converter, the first driving line group and the second driving line group.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
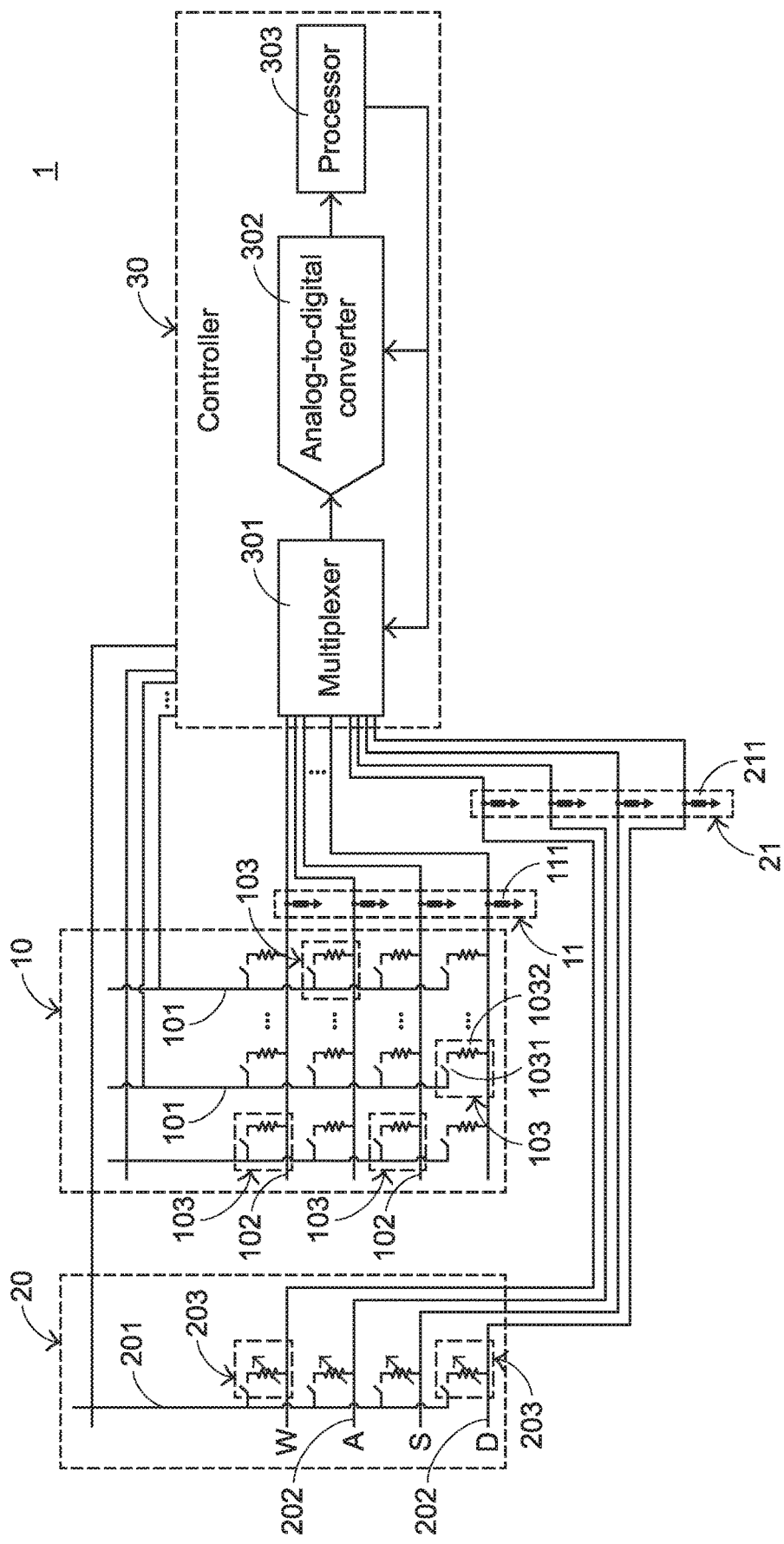
FIG. 1 is a schematic circuit diagram illustrating a composite function keyboard circuit according to an embodiment of the present invention.

FIG. 1 is a schematic circuit diagram illustrating a composite function keyboard circuit according to an embodiment of the present invention.

As shown in FIG. 1, the composite function keyboard circuit 1 at least comprises a first matrix circuit 10, a first bias resistor group 11, a second matrix circuit 20, a second bias resistor group 21 and a controller 30.

The first matrix circuit 10 comprises a first driving line group with plural first driving lines 101, a first sensing line group with plural first sensing lines 102 and a first switch unit group with plural first switch units 103. The plural first driving lines 101 are arranged along a vertical direction. The plural first sensing lines 102 are arranged along a horizontal direction. The plural first driving lines 101 and the plural first sensing lines 102 are arranged in a matrix. Each of the first switch units 103 is electrically connected with the corresponding one of the plural first driving lines 101 and the corresponding one of the plural first sensing lines 102.

The first bias resistor group 11 is electrically connected with the first sensing lines 102. In addition, the first bias resistor group 11 is connected with the first switch units 103 in series. The first bias resistor group 11 comprises plural first bias resistors 111. A first terminal of each first bias resistor 111 of the first bias resistor group 11 is electrically connected with the corresponding first sensing line 102 and the corresponding first switch unit 103. In addition, a second terminal of each first bias resistor 111 of the first bias resistor group 11 is connected with a ground terminal.

Due to cooperation of the first matrix circuit 10 and the first bias resistor group 11, the operation of a general key can achieve the ghost key preventing function. The operating principles will be described in more details later.

In an embodiment, the composite function keyboard circuit 1 further comprises a second matrix circuit 20 and a second bias resistor group 21. Consequently, the purpose of operating a single key to execute various types of key function instructions can be achieved. The second matrix circuit 20, the second bias resistor group 21, the first matrix circuit 10 and the first bias resistor group 11 are assembled in the same keyboard circuit 1. Consequently, the keyboard circuit 1 may be regarded as a composite function keyboard circuit.

Please refer to FIG. 1 again. The second matrix circuit 20 comprises a second driving line group with at least one second driving line 201, a second sensing line group with plural second sensing lines 202 and a second switch unit group with plural second switch units 203. The at least one second driving line 201 is arranged along a vertical direction. The plural second sensing lines 202 are arranged along a horizontal direction. The at least one second driving line 201 and the plural second sensing lines 202 are arranged in a matrix. Each of the second switch units 203 is electrically connected with the corresponding second sensing line 201 and the corresponding second sensing line 202.

For example, in the composite function keyboard circuit 1 as shown in FIG. 1, four independent keys "W", "A", "S" and "D" are selected to achieve the purpose of operating a single key to execute various types of key function instructions. The other keys are selectively in an on state or an off state. When any of the other keys is in the on state, a general key function instruction is executed. It is noted that the types and the number of independent keys are not restricted. That is, the types and the number of the independent keys for achieve the purpose of operating a single key to execute various types of key function instructions may be determined according to the practical requirements.

Please refer to FIG. 1 again. In the second matrix circuit 20, the second driving line group comprises a single second driving line 201, and the second sensing line group comprises four second sensing lines 202. The four second sensing lines 202 represent the four keys "W", "A", "S" and "D", respectively. These four sensing lines 202 are electrically connected with the controller 30 through the respective pins. The second switch unit group comprises four second switch units 203. Each of the four second switch units 203 are electrically connected with the single second driving line 201 of the second sensing line group and the corresponding second sensing line 202 of the second sensing line group.

The second bias resistor group 21 is electrically connected with the second sensing line group 202. In addition, the second bias resistor group 21 is electrically connected with the second switch units 203 of the second switch unit group in series. The second bias resistor group 21 comprises four second bias resistors 211. A first terminal of each second bias resistor 211 of the second bias resistor group 21 is electrically connected with the corresponding second sensing lines 202 of the second sensing line group and the corresponding second switch unit 203 of the second switch unit group. In addition, a second terminal of each second bias resistor 211 of the second bias resistor group 21 is connected with the ground terminal.

The controller 30 is electrically connected with the first driving lines 101 of the first driving line group, the second sensing lines 102 of the second sensing line group, the first terminals of the first bias resistors 111 of the first bias resistor group 11, the second driving line 201 of the second driving line group, the second sensing lines 202 of the second sensing line group 202 and the first terminals of the second bias resistors 211 of the second bias resistor group 21.

In an embodiment, the controller 30 comprises a multiplexer 301, an analog-to-digital converter 302 and a processor 303. The multiplexer 301 is electrically connected with the first sensing lines 102 of the first sensing line group 102, the first terminals of the first bias resistors 111 of the first bias resistor group 11, the second sensing lines 202 of the second sensing line group and the first terminals of the second bias resistors 211 of the second bias resistor group 21. The analog-to-digital converter 302 is electrically connected with the multiplexer 301. The processor 303 is electrically connected with the multiplexer 301, the analog-to-digital converter 302, the first driving lines 101 of the first driving line group and the at least one second driving line 201 of the second driving line group.

In accordance with a feature of the present invention, each of the second switch units 203 of the second switch unit group is an ink-type force sensing switch (FSR). The resistance of the ink-type force sensing switch is variable according to a keypress mode. In addition, an electrical connection path is defined by the ink-type force sensing switch and the corresponding second bias resistor 211 of the second bias resistor group 21. When the ink-type force sensing switch is electrically conductive or turned on, a divided sensing voltage (e.g., the voltage at the first terminal of the corresponding second bias resistor 211 of the second bias resistor group 21) is generated by the electrical connection path. According to the level of the divided sensing voltage, the controller 30 generates a corresponding key control instruction.

In an embodiment, the number of the second switch units 203 of the second switch unit group is equal to the number of the second bias resistors 211 of the second bias resistor group 21. Consequently, each second switch unit 203 of the second switch unit group is electrically connected with the corresponding second bias resistor 211 of the second bias resistor group 21.

Figure 2A:
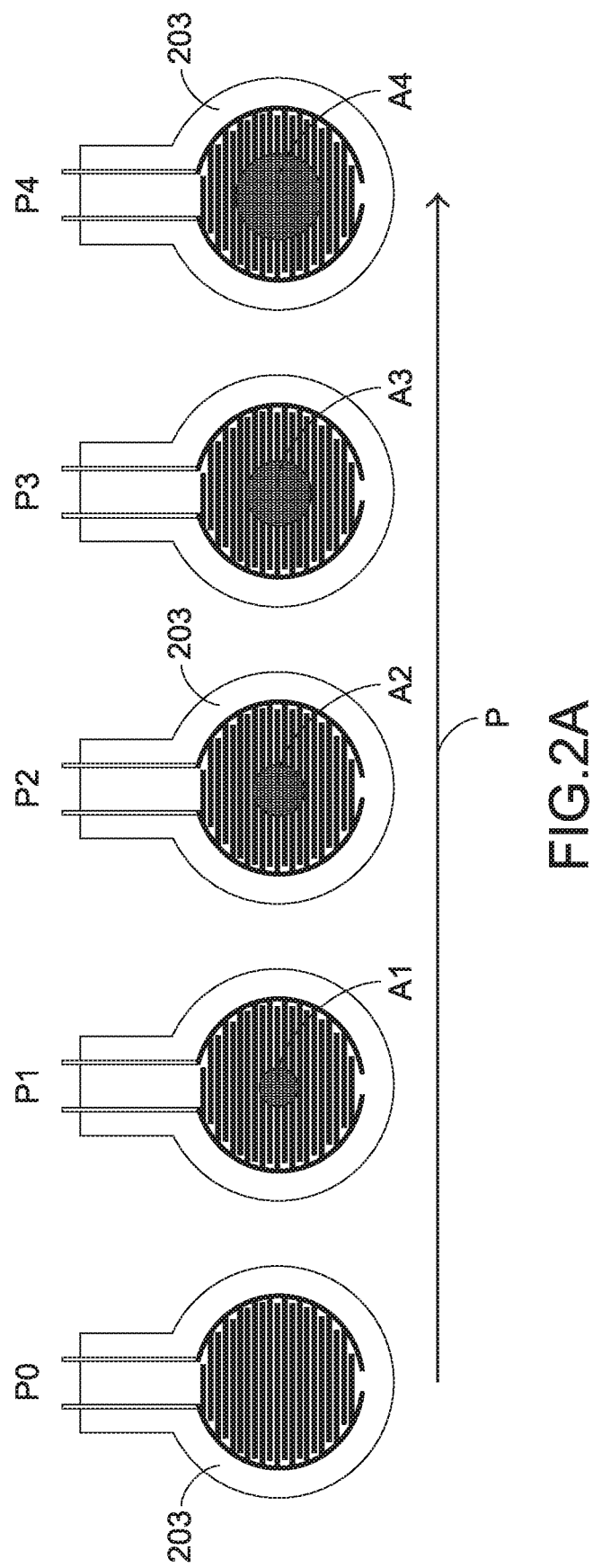
FIG. 2A schematically illustrates different operation modes of a second switch unit of the second switch unit group in the composite function keyboard circuit as shown in FIG. 1.

FIG. 2A schematically illustrates different operation modes of a second switch unit 203 of the second switch unit group in the composite function keyboard circuit as shown in FIG. 1. For example, the second switch unit 203 corresponds to one of the four independent keys "W", "A", "S" and "D". In addition, the second switch unit 203 is an ink-type force sensing switch.

As shown in FIG. 2A, a keypress action P is performed on one of the four independent keys "W", "A", "S" and "D" in response to a downward force. In the drawings of FIG. 2A, the magnitude of the downward force is gradually increased from left to right. The ink-type force sensing switch 203 comprises a top printed conductive film and a bottom printed conductive film, which will be described later.

In an initial mode P0 of the ink-type force sensing switch 203, the top printed conductive film and the bottom printed conductive film of the ink-type force sensing switch 203 are not contacted with each other. That is, the ink-type force sensing switch 203 is in an open-circuited state. Since there is no electrical contact area between the top printed conductive film and the bottom printed conductive film of the ink-type force sensing switch 203, the resistance of the ink-type force sensing switch 203 is the highest.

As the magnitude of the external force in response to the keypress action P is increased, the ink-type force sensing switch 203 is in a first pressing mode P1. Since there is a first electrical contact area A1 between the top printed conductive film and the bottom printed conductive film of the ink-type force sensing switch 203, the resistance of the ink-type force sensing switch 203 is decreased.

Similarly, as the magnitude of the external force in response to the keypress action P is further increased, the ink-type force sensing switch 203 is in a second pressing mode P2. Since there is a second electrical contact area A2 between the top printed conductive film and the bottom printed conductive film of the ink-type force sensing switch 203, the resistance of the ink-type force sensing switch 203 is further decreased.

Similarly, as the magnitude of the external force in response to the keypress action P is further increased, the ink-type force sensing switch 203 is in a third pressing mode P3. Since there is a third electrical contact area A3 between the top printed conductive film and the bottom printed conductive film of the ink-type force sensing switch 203, the resistance of the ink-type force sensing switch 203 is further decreased.

Similarly, as the magnitude of the external force in response to the keypress action P is further increased, the ink-type force sensing switch 203 is in a fourth pressing mode P4. Since there is a fourth electrical contact area A4 between the top printed conductive film and the bottom printed conductive film of the ink-type force sensing switch 203, the resistance of the ink-type force sensing switch 203 is further decreased.

Figure 2B:
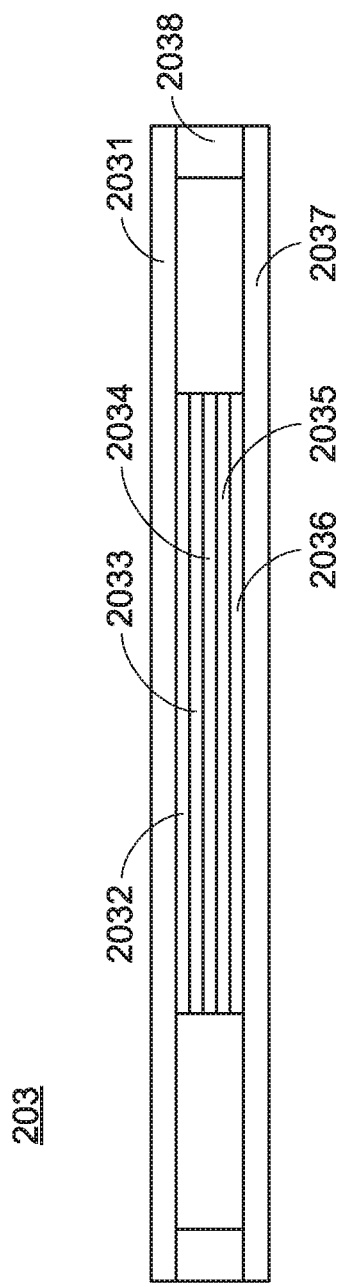
FIG. 2B is a schematic cross-sectional view illustrating a second switch unit of the second switch unit group in the composite function keyboard circuit as shown in FIG. 1.

Please refer to FIG. 2B. FIG. 2B is a schematic cross-sectional view illustrating a second switch unit of the second switch unit group in the composite function keyboard circuit as shown in FIG. 1. In FIG. 2B, the second switch unit 203 is an exemplary structure of an ink-type force sensing switch unit. Of course, the structure of the ink-type force sensing switch unit may be varied according to the practical requirements.

Please refer to FIG. 2B. In an embodiment, the ink-type force sensing switch unit 203 at least comprises a top printed conductive film, a bottom printed conductive film and an elastic separation layer 2034. The elastic separation layer 2034 is arranged between the top printed conductive film and the bottom printed conductive film. The top printed conductive film at least comprises a top substrate 2031, an upper conductive silver paste layer 2032 and an upper carbonaceous conductive ink layer 2033. The bottom printed conductive film at least comprises a lower carbonaceous ink layer 2035, a lower conductive silver paste layer 2036 and a bottom substrate 2037. In addition, an adhesive layer 2038 is arranged between the top substrate 2031 and the bottom substrate 2037.

Preferably, any of the top substrate 2031 and the bottom substrate 2037 is made of polyethylene terephthalate (PET), and the elastic separation layer 2034 is made of UV-curable adhesive.

Please refer to FIG. 1 again. As mentioned above, an electrical connection path is defined by the ink-type force sensing switch and the corresponding second bias resistor 211 of the second bias resistor group 21. When the ink-type force sensing switch is turned on, a divided sensing voltage (e.g., the voltage at the first terminal of the corresponding second bias resistor 211 of the second bias resistor group 21) is generated by the electrical connection path. According to the level of the divided sensing voltage, the controller 30 generates the corresponding key control instruction. For example, if the level of the divided sensing voltage is lower than a voltage threshold value, the ink-type force sensing switch 203 is in a light keypress mode. In the light keypress mode, the controller 30 generates a single key control instruction, for example a single key control instruction corresponding to the "W" key. Whereas, if the level of the divided sensing voltage is higher than or equal to the voltage threshold value, the ink-type force sensing switch 203 is in a heavy keypress mode. In the heavy keypress mode, the controller 30 generates a combination key control instruction, for example a combination key control instruction corresponding to the combination key "W"+"Shift".

Figure 3:
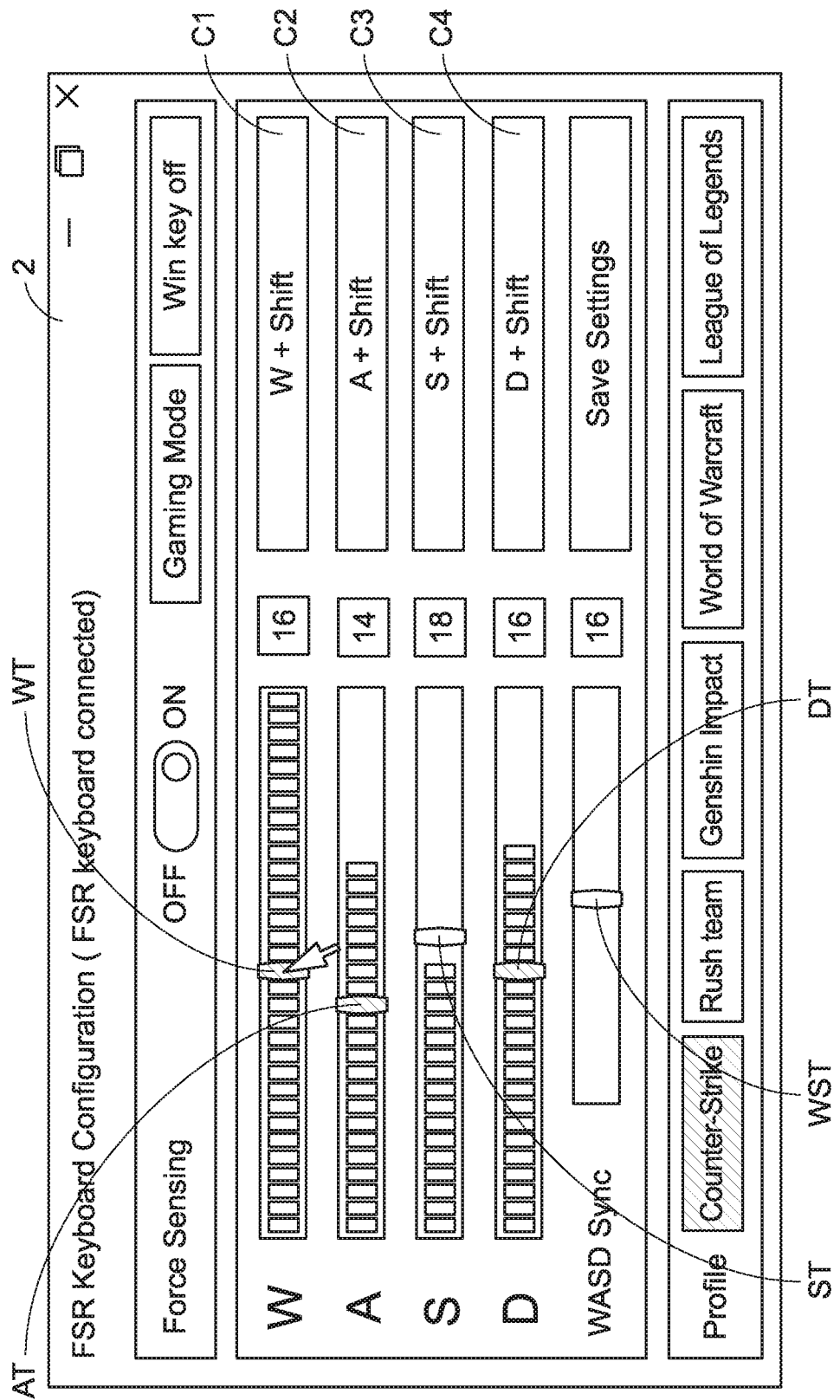
FIG. 3 schematically illustrates a process of defining the voltage threshold of a second switch unit of the second switch unit group in the composite function keyboard circuit as shown in FIG. 1 through an operation interface of an adjustment program.

FIG. 3 schematically illustrates a process of defining the voltage threshold of a second switch unit of the second switch unit group in the composite function keyboard circuit as shown in FIG. 1 through an operation interface of an adjustment program. The second switch unit 203 is an ink-type force sensing switch unit. When the adjustment program is executed, the operation interface of the adjustment program is shown on a display screen.

For example, the adjustment program is an application software (APP). The voltage threshold value can be set by the user through the operation interface 2 of the adjustment program in a user-defined manner.

For example, in the operation interface 2 shown in FIG. 3, the threshold voltage values WT, AT, ST and DT of the second switch units corresponding to the four independent keys "W", "A", "S" and "D" can be adjusted by the user. By sliding the corresponding adjustment bars leftwards, the threshold voltage values are decreased. By sliding the corresponding adjustment bars rightwards, the threshold voltage values are increased. Alternatively, by sliding an adjustment bar WST in the operation interface 2, the threshold voltage values WT, AT, ST and DT are adjusted synchronously. It is noted that the method of adjusting the threshold voltage value is not restricted.

For example, the second switch units 203 of the second switch unit group is an ink-type force sensing switch (FSR) corresponding to the "W" key. If the level of the divided sensing voltage in response to the keypress action is lower than the voltage threshold value WT, the ink-type force sensing switch 203 is in the light keypress mode. Meanwhile, the controller 30 generates a single key control instruction corresponding to the "W" key. Whereas, if the level of the divided sensing voltage in response to the keypress action is higher than or equal to the voltage threshold value WT, the ink-type force sensing switch 203 is in a heavy keypress mode. Meanwhile, the controller 30 generates a combination key control instruction C1 corresponding to the combination key "W"+"Shift".

For example, the second switch units 203 of the second switch unit group is an ink-type force sensing switch (FSR) corresponding to the "A" key. If the level of the divided sensing voltage in response to the keypress action is lower than the voltage threshold value AT, the ink-type force sensing switch 203 is in the light keypress mode. Meanwhile, the controller 30 generates a single key control instruction corresponding to the "A" key. Whereas, if the level of the divided sensing voltage in response to the keypress action is higher than or equal to the voltage threshold value AT, the ink-type force sensing switch 203 is in a heavy keypress mode. Meanwhile, the controller 30 generates a combination key control instruction C2 corresponding to the combination key "A"+"Shift".

For example, the second switch units 203 of the second switch unit group is an ink-type force sensing switch (FSR) corresponding to the "S" key. If the level of the divided sensing voltage in response to the keypress action is lower than the voltage threshold value ST, the ink-type force sensing switch 203 is in the light keypress mode. Meanwhile, the controller 30 generates a single key control instruction corresponding to the "S" key. Whereas, if the level of the divided sensing voltage in response to the keypress action is higher than or equal to the voltage threshold value ST, the ink-type force sensing switch 203 is in a heavy keypress mode. Meanwhile, the controller 30 generates a combination key control instruction C3 corresponding to the combination key "S"+"Shift".

For example, the second switch units 203 of the second switch unit group is an ink-type force sensing switch (FSR) corresponding to the "D" key. If the level of the divided sensing voltage in response to the keypress action is lower than the voltage threshold value DT, the ink-type force sensing switch 203 is in the light keypress mode. Meanwhile, the controller 30 generates a single key control instruction corresponding to the "D" key. Whereas, if the level of the divided sensing voltage in response to the keypress action is higher than or equal to the voltage threshold value DT, the ink-type force sensing switch 203 is in a heavy keypress mode. Meanwhile, the controller 30 generates a combination key control instruction C4 corresponding to the combination key "D"+"Shift".

Please refer to FIG. 1 again. As mentioned above, the use of the composite function keyboard circuit 1 can achieve the purpose of operating a single key to execute various types of key function instructions. In accordance with another feature of the present invention, the use of the composite function keyboard circuit 1 can achieve the ghost key preventing function for the general key.

In the first embodiment of FIG. 1, due to cooperation of the first matrix circuit 10 and the first bias resistor group 11 can achieve the ghost key preventing function. In the first matrix circuit 10, each of the first switch units 103 in the first switch unit group comprises a key switch 1031 and a switch resistor 1032. Moreover, the key switch 1031 and the corresponding switch resistor 1032 in each first switch unit 103 are collaboratively formed as an additional electrical connection path. If the key switch 1031 of a specified first switch unit 103 is not pressed down, the specified key switch 103 is turned off. If the key switch 1031 of the specified first switch unit 103 is turned on, a divided conduction voltage from the key switch 1031 can be obtained by the controller 30 through the additional electrical connection path according to a voltage divider rule. According to the divided conduction voltage, the controller 30 judges whether the key switch 1031 of the specified first switch unit 103 is effectively pressed down and turned on.

Preferably but not exclusively, the resistance of the switch resistor 1032 in each first switch unit 103 and the resistance of the corresponding first bias resistor 111 are equal or nearly equal. Consequently, according to a voltage divider rule, the divided conduction voltage is equal to or nearly equal to a half of the working voltage.

In addition, each of the first bias resistors 111 of the first bias resistor group 11 is connected with the corresponding first sensing line 102 of the first sensing line group. Consequently, the divided conduction voltage can be transmitted to the multiplexer 301 through the corresponding first sensing line 102 of the first sensing line group.

Preferably but not exclusively, the switch resistor 1032 is a resistive element, an equivalent resistive circuit or any other appropriate element with required resistance.

In an embodiment, the controller 30 provides a working voltage to the first driving line group with plural first driving lines 101 sequentially and periodically. For example, the working voltage is a voltage for powering a general keyboard device in a normal working state.

Firstly, at a first time point, the controller 60 provides the working voltage to a first driving line 101 of the first driving line group. After the working voltage is provided to the first driving line 101, the working voltage is provided to the plural first switch units that are connected with the first driving line 101. Then, each of the plural first switch units connected with the first driving line generate a corresponding divided conduction voltage to the corresponding first sensing line 102 of the first sensing line group. Then, at a second time point, the controller 30 provides the working voltage to a next first driving line 101 of the first driving line group. After the working voltage is provided to the next first driving line 101, the working voltage is provided to the plural first switch units that are connected with the next first driving line 101. Then, each of the plural first switch units connected with the next first driving line generate a corresponding divided conduction voltage to the corresponding first sensing line 102 of the first sensing line group.

The above procedures are repeatedly done. Consequently, the first switch units connected with the other first driving lines 10 will successively generate the corresponding divided conduction voltages to the corresponding first sensing lines 102 at different time points.

The divided conduction voltages from the plural first sensing lines 102 are received by the multiplexer 301. These divided conduction voltages are successively transmitted from the multiplexer 301 to the analog-to-digital converter 302. Moreover, these divided conduction voltages are successively transmitted from the analog-to-digital converter 302 to the processor 303 in order to be judged by the processor 303.

The processor 303 judges whether the key switches 1031 of the first switch units 103 are normally turned on according to the divided conduction voltages from the corresponding first sensing lines 102. For example, if the divided conduction voltage lies in a first voltage range, the processor 303 judges that the key switch 1031 of the corresponding first switch unit 103 is normally turned on. Under this circumstance, the key signal corresponding to this key switch 1031 is generated.

On the other hand, if the divided conduction voltage lies in a second voltage range, the processor 303 judges that the key switch 1031 of the corresponding first switch unit 103 is turned off. The second voltage range is lower than the first voltage range, but higher than zero. Moreover, if the divided conduction voltage lies in the second voltage range, the key switch 1031 of the corresponding first switch unit 103 is regarded as a ghost key. Under this circumstance, the key signal corresponding to this key switch 1031 will not be generated.

In an embodiment, the first voltage range is from 0.228×Vin to 0.5×Vin, and the second voltage range is 0.064×Vin to 0.226×Vin, wherein Vin is the working voltage. In an embodiment, the working voltage is 5V. In other words, the first voltage range is from 1.14V to 2.5V, and the second voltage range is 0.32V to 1.13V.

If the divided conduction voltage is in the range between 1.14V and 2.5V, the processor 303 judges that the switch circuit 1031 generating the divided voltage is normally turned on. Under this circumstance, the key signal is generated. Whereas, if the divided voltage is lower than 1.13V, the processor 303 judges that the switch circuit 1031 generating the divided voltage is turned off and the switch circuit 1031 is not triggered. Under this circumstance, the key signal will not be generated.

From the above descriptions, the present invention provides the composite function keyboard circuit. The composite function keyboard circuit is capable of executing various types of key function instructions with a single keypress action while avoiding the ghost key phenomenon. In other words, the composite function keyboard circuit of the present invention are industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A composite function keyboard circuit, comprising:
a first matrix circuit comprising a first driving line group with plural first driving lines, a first sensing line group with plural first sensing lines and a first switch unit group with plural first switch units, wherein the plural first driving lines and the plural first sensing lines are arranged in a matrix, and each of the first switch units of the first switch unit group is electrically connected with a corresponding first sensing line and a corresponding first sensing line;
a first bias resistor group electrically connected with the first sensing line group and electrically connected with the first switch unit group in series, wherein the first bias resistor group comprises plural first bias resistors, a first terminal of each of the plural first bias resistors of the first bias resistor group is electrically connected with the first sensing line group and the first switch unit group, and a second terminal of each of the plural first bias resistors of the first bias resistor group is electrically connected with a ground terminal;
a second matrix circuit comprising a second driving line group with at least one second driving line, a second sensing line group with plural second sensing lines and a second switch unit group with plural second switch units, wherein the at least one second driving line and the plural second sensing lines are arranged in a matrix, and each of the second switch units of the second switch unit group is electrically connected with a corresponding second sensing line and a corresponding second sensing line;
a second bias resistor group electrically connected with the second sensing line group and electrically connected with the second switch unit group in series, wherein the second bias resistor group comprises plural second bias resistors, a first terminal of each of the plural second bias resistors of the second bias resistor group is electrically connected with the second sensing line group and the second switch unit group, and a second terminal of each of the plural second bias resistors of the second bias resistor group is electrically connected with the ground terminal; and
a controller electrically connected with the first driving line group, the first sensing line group, the first terminal of each of the first bias resistors of the first bias resistor group, the second driving line group, the second sensing line group and the first terminal of each of the second bias resistors of the second bias resistor group,
wherein each of the second switch units of the second switch unit group is an ink-type force sensing switch, a resistance of the ink-type force sensing switch is variable according to a pressing mode of a keypress action, and an electrical connection path is formed between the ink-type force sensing switch and a corresponding second bias resistor of the second bias resistor group, wherein when the ink-type force sensing switch is electrically conductive, a divided sensing voltage is generated by the electrical connection path, and the controller generates a corresponding key control instruction according to a level of the divided sensing voltage.

2. The composite function keyboard circuit according to claim 1, wherein a number of the second switch units of the second switch unit group and a number of the second bias resistors of the second bias resistor group are identical, so that each of the second switch units of the second switch unit group is electrically connected with one of the plural second bias resistors of the second bias resistor group.

3. The composite function keyboard circuit according to claim 1, wherein the controller comprises a multiplexer, an analog-to-digital converter and a processor, wherein the multiplexer is electrically connected with the first sensing line group, the first terminal of each of the plural first bias resistors of the first bias resistor group, the second sensing line group and the first terminal of each of the plural second bias resistors of the second bias resistor group, the analog-to-digital converter is electrically connected with the multiplexer, and the processor is electrically connected with the multiplexer, the analog-to-digital converter, the first driving line group and the second driving line group.

4. The composite function keyboard circuit according to claim 1, wherein the ink-type force sensing switch unit comprises at least a top printed conductive film, a bottom printed conductive film and an elastic separation layer, wherein the elastic separation layer is arranged between the top printed conductive film and the bottom printed conductive film.

5. The composite function keyboard circuit according to claim 4, wherein the top printed conductive film comprises at least a top substrate, an upper conductive silver paste layer and an upper carbonaceous conductive ink layer, and the bottom printed conductive film comprises at least a lower carbonaceous ink layer, a lower conductive silver paste layer and a bottom substrate, wherein an adhesive layer is arranged between the top substrate and the bottom substrate.

6. The composite function keyboard circuit according to claim 5, wherein at least one of the top substrate and the bottom substrate is made of polyethylene terephthalate (PET), or the elastic separation layer is made of UV (ultraviolet)-curable adhesive.

7. The composite function keyboard circuit according to claim 1, wherein when the level of the divided sensing voltage corresponding to the ink-type force sensing switch is lower than a voltage threshold value, the ink-type force sensing switch is in a light keypress mode, and the controller generates a single key control instruction, wherein when the level of the divided sensing voltage is higher than or equal to the voltage threshold value, the ink-type force sensing switch is in a heavy keypress mode, and the controller generates a combination key control instruction.

8. The composite function keyboard circuit according to claim 7, wherein the voltage threshold value is set by a user through an application software.

9. The composite function keyboard circuit according to claim 1, wherein each of the first switch units of the first switch unit group comprises a key switch and a switch resistor, wherein the key switch and the corresponding switch resistor in each first switch unit are collaboratively formed as an additional electrical connection path, wherein when the key switch of a specified first switch unit of the plural first switch units is electrically conductive, a divided conduction voltage from the key switch of the specified first switch unit is obtained by the controller through the additional electrical connection path, and the controller judges whether the key switch of the specified first switch unit is effectively pressed down and normally turned on.

10. The composite function keyboard circuit according to claim 9, wherein a resistance of the switch resistor in each first switch unit is equal to or nearly equal to a resistance of a corresponding first bias resistor.

11. The composite function keyboard circuit according to claim 9, wherein each of the plural first driving lines of the first driving line group is connected with the key switch of at least one first switch unit, and the switch resistor of the at least one first switch unit is electrically connected with the first sensing line group.

12. The composite function keyboard circuit according to claim 11, wherein at a first time point, the controller provides a working voltage to a first one of the plural first driving lines of the first driving line group, and the divided conduction voltages from the at least one first switch unit connected with the first one of the plural first driving lines are transmitted through the first sensing line group, wherein at a second time point, the controller provides the working voltage to a second one of the plural first driving lines of the first driving line group, and the divided conduction voltages from the at least one first switch circuit connected with the second one of the plural first driving lines are transmitted through the first sensing line group.

13. The composite function keyboard circuit according to claim 12, wherein when the divided conduction voltage corresponding to a specified first switch unit of the plural first switch units lies in a first voltage range, the controller judges that the key switch of the specified first switch unit is normally turned on, wherein when the divided conduction voltage corresponding to the specified first switch unit lies in a second voltage range, the controller judges that the key switch of the specified first switch unit is not normally turned on.

14. The composite function keyboard circuit according to claim 13, wherein the working voltage is Vin, and the first voltage range is from 0.228×Vin to 0.5×Vin.

15. The composite function keyboard circuit according to claim 13, wherein the working voltage is Vin, and the second voltage range is 0.064×Vin to 0.226×Vin.

16. The composite function keyboard circuit according to claim 12, wherein the working voltage is 5V.

17. The composite function keyboard circuit according to claim 16, wherein the first voltage range is from 1.14V to 2.5V.

18. The composite function keyboard circuit according to claim 16, wherein the second voltage range is 0.32V to 1.13V.

* * * * *